United States Patent [19]
Lee

[11] Patent Number: 5,805,410
[45] Date of Patent: Sep. 8, 1998

[54] MOS CAPACITOR FOR IMPROVING ELECTROSTATIC DURABILITY BY USING OF A TRANSISTOR

[75] Inventor: Ho-Jin Lee, Seoul, Rep. of Korea

[73] Assignee: Samsung Electronics Co., Ltd., Suwon, Rep. of Korea

[21] Appl. No.: 758,040

[22] Filed: Nov. 27, 1996

[30] Foreign Application Priority Data

Dec. 8, 1995 [KR] Rep. of Korea ............... 95-47987

[51] Int. Cl.⁶ ............................................. H01G 4/005
[52] U.S. Cl. ................ 361/303; 361/306.1; 361/322; 361/329; 257/532; 257/516
[58] Field of Search ................ 361/321.4, 321.5, 361/305, 303, 311, 306.1, 312, 313, 328, 322, 329; 257/516, 596, 379, 532, 595, 528; 438/327, 237, 325, 234, 238, 239, 254, 322, 324, 329, 393, 394

[56] References Cited

U.S. PATENT DOCUMENTS

| 4,377,029 | 3/1983 | Ozawa | 438/327 |
| 4,491,746 | 1/1985 | Koike | 327/534 |
| 4,688,323 | 8/1987 | Yoshida et al. | 438/237 |
| 5,089,875 | 2/1992 | Koyama | 257/532 |

*Primary Examiner*—Kristine L. Kincaid
*Assistant Examiner*—Anthony Dinkins
*Attorney, Agent, or Firm*—Jones & Volentine, L.L.P.

[57] ABSTRACT

The present invention relates to a MOS capacitor. According to this invention, the MOS capacitor has a transistor structure. One electrode of the capacitor is connected to an emitter of the transistor and the other electrode of the capacitor is connected to a collector of the transistor. When the MOS capacitor is biased by static electricity the electrostatic durability is improved, since an electrostatic discharge path is formed by breakdown of a collector and an emitter.

8 Claims, 4 Drawing Sheets

MOS CAPACITOR FOR IMPROVING ELECTROSTATIC DURABILITY BY USING OF A TRANSISTOR

BACKGROUND OF THE INVENTION

The present invention relates to a semiconductor device. More particularly the present invention relates to a metal-oxide-semiconductor (MOS) capacitor.

Generally, in a simple memory circuit, a transistor is used as a switching device and a small MOS capacitor is used as an accumulating device. A small electric charge is accumulated in or withdrawn from a capacitor to hold the data in the memory circuit.

A conventional MOS capacitor will now be described specifically with reference to the attached drawings.

FIG. 1A is a cross-sectional view showing a conventional MOS capacitor made by etching a polysilicon layer. As shown in FIG. 1A an $N^-$ type epitaxial layer 3 is formed over a $P^-$ type substrate 1. A $P^+$ type isolation region 4 surrounding the epitaxial layer 3 is also formed in contact with the substrate 1. Insulating layers, including an oxide layer 17 and a nitride layer 18, are formed over the epitaxial layer 3. A polysilicon layer 6 doped with N type impurities of a high dose and an oxide layer 7 are formed over the insulating layers 17 and 18 . The oxide layer 7 is partially etched and a first electrode 9 is connected to the polysilicon layer 6 through the etched part of the oxide layer 7. A second electrode 8 is formed on the oxide layer 7 and is not connected to the first electrode 9.

FIG. 1B is a circuit diagram of the device shown in FIG. 1A. As shown in FIG. 1B, the circuit is simply a capacitor 100 between the node $N_1$ at the second electrode 8 and the node $N_2$ at the first electrode 9.

FIG. 2A is a cross-sectional view showing a conventional MOS capacitor made by diffusion. As shown in FIG. 2A, an $N^+$ type buried layer 2 and an $N^-$ type epitaxial layer 3 are formed over a $P^-$ type substrate 1. A $P^+$ type isolation region 4 surrounding the epitaxial layer 3 is also formed in contact with the substrate 1. An $N^+$ type diffusion region 5 is formed in the epitaxial layer 3 and an oxide layer 7 is formed over the epitaxial layer 3, the isolation region 4, and the diffusion region 5. A part of the oxide layer 7 formed over the $N^+$ type diffusion region 5 is partially etched and a first electrode 9 is connected to the $N^+$ type diffusion region 5 through 5 the etched part of the oxide layer 7. A second electrode 8 is formed over the portion of the oxide layer 7 over the $N^+$ type diffusion layer 5 and is separated from the first electrode 9.

FIG. 2B is a circuit diagram of the device shown in FIG. 2A. As shown in FIG. 2B, the circuit is simply a capacitor 200 between the node $N_1$ at the second electrode 8 and the node $N_2$ at the first electrode 9.

These conventional MOS capacitors have either a doped polysilicon layer or a diffusion region connected to the first electrode. Those MOS capacitors that have a doped polysilicon layer connected to the first electrode have electric charge accumulated. Those MOS capacitors that have a diffusion region connected to the first electrode have electric charge withdrawn.

These conventional MOS capacitors have a problem, however, in that the elements are easily broken even when an electrostatic discharge voltage is low.

SUMMARY OF THE INVENTION

An object of the present invention is to improve electrostatic durability by forming an electrostatic discharge path.

In order to achieve this object, a MOS capacitor according to the present invention comprises a first region of a first conductive type formed in a semiconductor layer, a second region of a second conductive type formed in the semiconductor layer, and a third region of the first conductive type formed in the second region, wherein the first and the third regions are electrically connected to each other and the second region is left unconnected.

As another example, a MOS capacitor according to the present invention comprises a first diffusion region of a first conductive type formed in a semiconductor layer, a second diffusion region of a second conductive type, formed in the semiconductor layer and disconnected from the first diffusion region, a third diffusion region of a first conductive type formed in the second diffusion region, a first polysilicon layer formed over the first diffusion region, a second polysilicon layer formed over the third diffusion region and separated from the first polysilicon layer, a first metal electrode and a second metal electrode respectively formed on the first polysilicon layer and the second polysilicon layer, the first and second metal electrodes being disconnected from each other, an insulating layer formed over the first polysilicon layer, and a third metal electrode, formed over the insulating layer, disconnected from the first metal electrode and electrically connected to the second metal electrode.

As the other example, a MOS capacitor according to the present invention comprises a first diffusion region of a first conductive type formed in a semiconductor layer, a second diffusion region of a second conductive type formed in the semiconductor layer and disconnected from the first diffusion region, a third diffusion region of the first conductive type formed in the second diffusion region, an oxide layer formed over the first diffusion layer, a first electrode and a second electrode which are respectively formed on the first diffusion region and the third diffusion region and which are disconnected from each other, and a third electrode which is formed on the oxide layer formed on the first diffusion region and which is disconnected from the first electrode and electrically connected to the second electrode.

In this MOS capacitors according to the present invention, a transistor is formed in a MOS capacitor and an electrode of the capacitor is connected to an emitter of the transistor and a collector of the transistor act on an electrode of the capacitor. When MOS capacitor is biased by static electricity the electrostatic durability is improved, since an electrostatic discharge path is formed by a voltage breakdown of a collector and an emitter.

BRIEF DESCRIPTION OF THE DRAWINGS

The preferred embodiment of the present invention will now be described more specifically with reference to the attached drawings, wherein.

DETAILED DESCRIPTION OF THE PREFERRED EMBODIMENTS

Preferred embodiments of the present invention will become apparent from a study of the following detailed description, when viewed in light of the accompanying drawings.

Figure 1A:
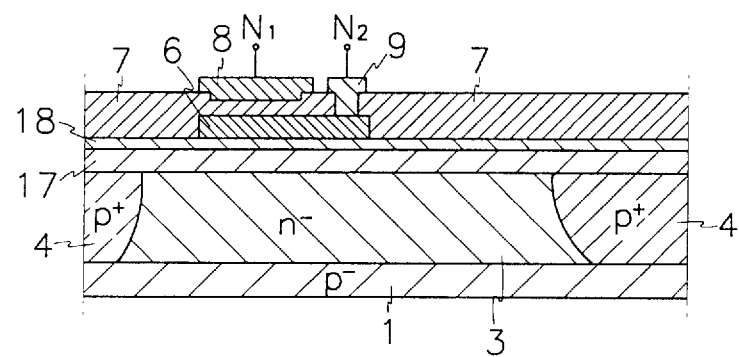
FIG. 1A is a cross-sectional view showing a conventional MOS capacitor made by etching a polysilicon layer.
Figure 1B:
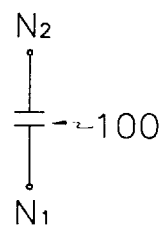
FIG. 1B is a circuit diagram of the device shown in FIG. 1A.
Figure 2A:
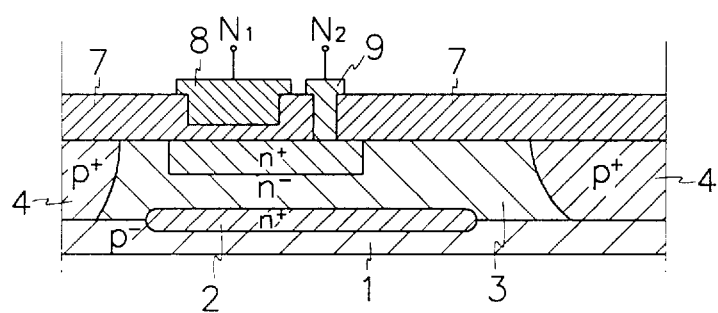
FIG. 2A is a cross-sectional view showing a conventional MOS capacitor made by diffusion.
Figure 2B:
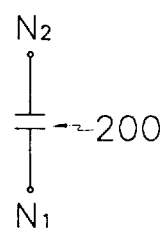
FIG. 2B is a circuit diagram of the device shown in FIG. 2A.
Figure 3A:
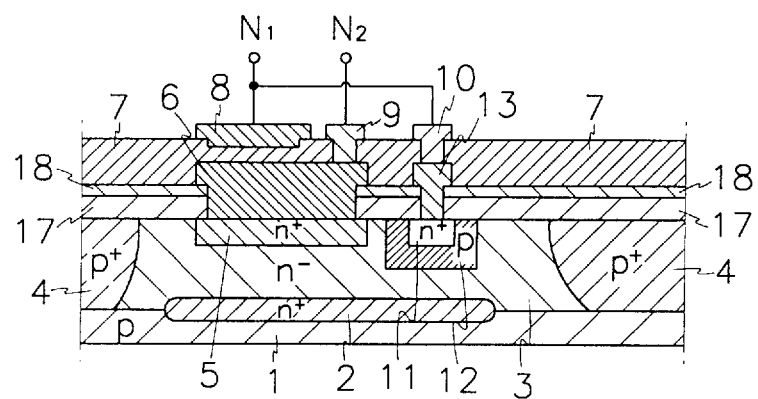
FIG. 3A is a cross-sectional view showing a MOS capacitor made by etching a polysilicon according to a first preferred embodiment of the present invention.

FIG. 3A is a cross-sectional view showing a MOS capacitor made by etching a polysilicon according to a first preferred embodiment of the present invention.

As shown in FIG. 3A, an $N^+$ type buried layer 2 and an $N^-$ type epitaxial layer 3 are formed in a $P^-$ type substrate 1. A $P^+$ type isolation region 4 is formed in the sides of the epitaxial layer 3 and this region is in contact with the substrate 1.

A P type diffusion region 11 is formed in the epitaxial layer 3 and a first $N^+$ type diffusion region 12 is formed in the P type diffusion region 11. A second $N^+$ type diffusion region 5 is formed in the epitaxial layer 3 and the second $N^+$ type diffusion region 5 is separated from the P type diffusion region 11. A second doped polysilicon layer 6 and a first doped polysilicon layer 13 are respectively formed on the $N^+$ type diffusion regions 5 and 12. Since electrodes of a capacitor are formed on the second $N^+$ type diffusion region 5, the second $N^+$ type diffusion region 5 is wider than the first $N^+$ type diffusion region 12.

A first oxide layer 17 and a nitride layer 18 are formed over the epitaxial layer 3. The portion of the first oxide layer 17 and the nitride layer 18 that are also formed over the first $N^+$ type diffusion region 12 and the second $N^+$ type diffusion region 5 are partially etched. Doped polysilicon layers 13 and 6 are partially formed on the first $N^+$ type diffusion region 12 and the second $N^+$ type diffusion region 5 respectively. Then the first doped polysilicon layer 13 and second doped polysilicon layer 6 respectively in contact with the first $N^+$ type diffusion region 12 and the second $N^+$ type diffusion region 5 through the etched parts of the first oxide layer 17 and the nitride layer 18. The second and first doped polysilicon layers 6 and 13 are separated from each other.

A second oxide layer 7 is formed over the nitride layer 18. The portion of the second oxide layer 7 that is also over the first $N^+$ type diffusion region 12 and the second $N^+$ type diffusion region 5 is partially etched. A first electrode 10 and a second electrode 9 are respectively connected to the first doped polysilicon layer 13 and the second doped polysilicon layer 6 through the etched parts of the second oxide layer 7.

A third electrode 8 is formed over the second oxide layer 7 and over the second doped polysilicon layer 6. This third electrode 8 is not connected to the second electrode 9 but is electrically connected the first electrode 10.

The first $N^+$ type diffusion region 12, the second $N^+$ type diffusion region 5 and the P type diffusion region 11 function respectively as an emitter, a collector, and a base of a conventional NPN transistor.

Figure 3B:
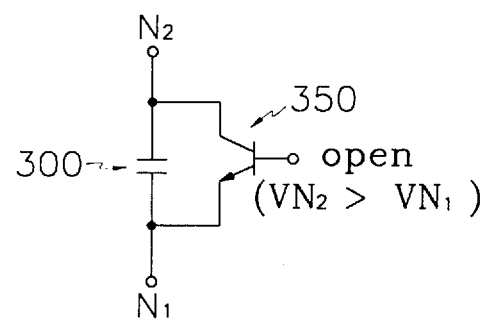
FIG. 3B is a circuit diagram of the device shown in FIG. 3A.

FIG. 3B is a circuit diagram of the device shown in FIG. 3A. As shown in FIG. 3B, the circuit comprises a capacitor 300 and a transistor 350. The capacitor 300 is set between the node $N_1$ at the third electrode 8 and the node $N_2$ at the second electrode 9. The transistor 350 has its base unconnected, its collector connected to node $N_2$, and its emitter connected to the node $N_1$. In this circuit, the voltage at the node $N_2$, $V_{N2}$, is greater than the voltage at the node $N_1$, $V_{N1}$.

Figure 4A:
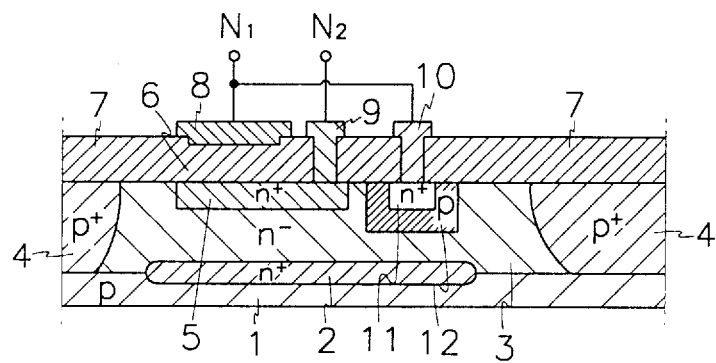
FIG. 4A is a cross-sectional view showing a MOS capacitor made by diffusion according to a second preferred embodiment of the present invention.

FIG. 4A is a cross-sectional view showing a MOS capacitor by created by diffusion according to a second preferred embodiment of the present invention. As shown in FIG. 4A, an $N^+$ type buried layer 2 and an $N^-$ type epitaxial layer 3 are formed in a $P^-$ type substrate 1. A $P^+$ type isolation region 4 which is formed in the sides of the epitaxial layer 3 is connected to the substrate 1. A P type diffusion region 11 is formed in the epitaxial layer 3 and a first $N^+$ type diffusion region 12 is formed in the P type diffusion region 11. A second $N^+$ type diffusion region 5 is formed in the epitaxial layer 3 and the second $N^+$ type diffusion region 5 is disconnected from the P type diffusion region 11. Since electrodes of a capacitor are formed on the second $N^+$ type diffusion region 5, the second $N^+$ type diffusion region 5 is wider than the first $N^+$ type diffusion region 12.

The first $N^+$ type diffusion region 12, the second $N^+$ type diffusion region 5 and the P type diffusion region 11 respectively function as an emitter, a collector, and a base of a conventional transistor.

An oxide layer 7 is formed over the $N^-$ type epitaxial layer 3 and the $P^+$ type isolation region 4. The parts of the oxide layer 7 also formed over the first $N^+$ type diffusion region 12 and the second $N^+$ type diffusion region 5 are partially etched. In these parts, a first electrode 10 and a second electrode 9 are respectively connected to the first $N^+$ type diffusion region 12 and the second $N^+$ type diffusion region 5. A third electrode 8 is formed on the oxide layer 7 formed on the second $N^+$ type diffusion region 5 and is not connected to the second electrode 9 but is electrically connected to the first electrode 10.

Figure 4B:
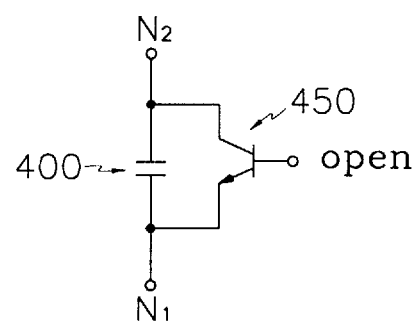
FIG. 4B is a circuit diagram of the device shown in FIG. 4A.

FIG. 4B is a circuit diagram of the device shown in FIG. 4A. As shown in FIG. 4B, the circuit comprises a capacitor 400 and a transistor 450. The capacitor 400 is set between the node $N_1$ at the third electrode 8 and the node $N_2$ at the second electrode 9. The transistor 450 has its base unconnected, its collector connected to node $N_2$, and its emitter connected to the node $N_1$. In this circuit, the voltage at the node $N_2$, $V_{N2}$, is greater than the voltage at the node $N_1$, $V_{N1}$.

The MOS capacitors according to the present invention therefore have a transistor structure. An electrode of the capacitor is connected to an emitter of the transistor and a collector of the transistor act on an electrode of the capacitor. And a base of the transistor is floating or open. Then, when a MOS capacitor is biased by external static electricity, an electrostatic discharge path is created by a voltage breakdown of a collector and an emitter. This has the effect of improving the electrostatic durability of the resulting circuit.

The present invention is not limited to the above-described embodiments. Various changes and modifications may be effected by one having an ordinary skill in the art and remain within the scope of the invention, as defined by the appended claims.

What is claimed is:

1. A capacitor comprising:
    a first region of a first conductive type formed in a semiconductor layer;
    a second region of a second conductive type formed in the semiconductor layer; and
    a third region of the first conductive type formed in the second region, wherein the first and the third regions are electrically connected to first and second electrodes respectively and the second region is left unconnected.

2. A capacitor as recited in claim 1, wherein the first region is wider than the third region.

3. A capacitor, comprising:

a first diffusion region of a first conductive type formed in a semiconductor layer;

a second diffusion region of a second conductive type, formed in the semiconductor layer and disconnected from the first diffusion region;

a third diffusion region of a first conductive type formed in the second diffusion region;

a first polysilicon layer formed over the first diffusion region;

a second polysilicon layer formed over the third diffusion region and separated from the first polysilicon layer;

a first metal electrode and a second metal electrode respectively formed on the first polysilicon layer and the second polysilicon layer, the first and second metal electrodes being disconnected from each other;

an insulating layer formed over the first polysilicon layer; and a third metal electrode, formed over the insulating layer, disconnected from the first metal electrode and electrically connected to the second metal electrode.

4. A capacitor as recited in claim 3, wherein the first diffusion region is wider than the third diffusion region.

5. A capacitor as recited in claim 3, further comprising a dielectric layer formed between the first and the second polysilicon layers.

6. A capacitor as recited in claim 5, wherein the dielectric layer comprises an oxide layer between the first and the second polysilicon layers and a nitride layer formed over the oxide layer.

7. A capacitor, comprising:

a first diffusion region of a first conductive type formed in a semiconductor layer;

a second diffusion region of a second conductive type formed in the semiconductor layer and disconnected from the first diffusion region;

a third diffusion region of the first conductive type formed in the second diffusion region;

an oxide layer formed over the first diffusion region;

a first electrode and a second electrode which are respectively formed on the first diffusion region and the third diffusion region and which are disconnected from each other; and a third electrode which is formed on the oxide layer formed on the first diffusion region and which is disconnected from the first electrode and electrically connected to the second electrode.

8. A capacitor as recited in claim 7, wherein the first diffusion region is wider than the third diffusion region.

* * * * *